United States Patent [19]
Arita et al.

[11] Patent Number: 6,046,490
[45] Date of Patent: Apr. 4, 2000

[54] SEMICONDUCTOR DEVICE HAVING A CAPACITOR DIELECTRIC ELEMENT AND WIRING LAYERS

[75] Inventors: Koji Arita, Colorado Springs, Colo.; Eiji Fujii, Osaka, Japan; Yasuhiro Uemoto, Shiga, Japan; Yoshihisa Nagano, Osaka, Japan; Akihiro Matsuda, Colorado Springs, Colo.

[73] Assignee: Matsushita Electronics Corporation, Osaka, Japan

[21] Appl. No.: 09/132,023

[22] Filed: Aug. 10, 1998

[51] Int. Cl.⁷ ................................................. H01L 29/40
[52] U.S. Cl. ........................... 257/535; 257/310; 257/649
[58] Field of Search .................................... 257/296, 306, 257/532, 535, 310, 649

[56] References Cited

U.S. PATENT DOCUMENTS

| | | |
|---|---|---|
| 5,135,608 | 8/1992 | Okutani . |
| 5,624,864 | 4/1997 | Arita et al. . |
| 5,689,126 | 11/1997 | Takaishi ................................. 257/306 |

FOREIGN PATENT DOCUMENTS

| | | |
|---|---|---|
| 3-180040 | 8/1991 | Japan . |
| 7-221070 | 8/1995 | Japan . |
| 7-226443 | 8/1995 | Japan . |
| 8-153707 | 6/1996 | Japan . |
| 8-296067 | 11/1996 | Japan . |
| 9-279367 | 10/1997 | Japan . |
| 10-22464 | 1/1998 | Japan . |

*Primary Examiner*—David Hardy
*Attorney, Agent, or Firm*—Merchant & Gould P.C.

[57] ABSTRACT

A semiconductor device is provided with a multilayered interconnection and a capacitor dielectric element, in which the transistor in the device has a non-degraded characteristics and the degradation of the capacitor dielectric element is suppressed. The semiconductor device has wiring layers connecting to one another through contact holes in insulating layers. One of the insulating layers is formed so as to cover at least a part of the area above the transistor and so as not to cover the area above the capacitor dielectric element. Hydrogen generated by heat-treating the insulating layer is supplied to the transistor to recover the damage in it, while hydrogen is suppressed from arriving at the capacitor element so that the capacitor dielectric element does not degrade.

7 Claims, 9 Drawing Sheets

SEMICONDUCTOR DEVICE HAVING A CAPACITOR DIELECTRIC ELEMENT AND WIRING LAYERS

FIELD OF THE INVENTION

The present invention relates to a semiconductor device including a capacitor element which has a capacitor dielectric film with high dielectric constant or ferroelectric characteristics as a capacitor dielectric layer. More particularly, the present invention relates to a semiconductor device requiring a multilayer interconnection.

BACKGROUND OF THE INVENTION

Recently, undesirable radiation, that is, electromagnetic wave noise generated from electronic equipment, has been a serious problem. As a method to decrease such undesirable radiation, a technique to integrate capacitor elements with large capacity in semiconductor integrated circuit devices and the like has attracted attention. Such capacitor elements have capacitor dielectric layers of dielectric with a high dielectric constant (hereinafter, high dielectric). Moreover, research and development concerning a capacitor element that includes a ferroelectric film having spontaneous polarization characteristics as a dielectric layer has been attracted much attention. Such a capacitor element is needed for practically applying a non-volatile RAM that enables writing and reading with lower operating voltage and higher speed compared to conventional devices.

A conventional semiconductor device having a capacitor element is explained below referring to FIG. 8, a partial cross-sectional view of a conventional semiconductor device.

As shown in FIG. 8, a field oxide film 2 is formed on a silicon substrate 1. The field oxide film 2 surrounds a transistor including a diffused layer 3, a gate insulator (gate oxide) 4 and a gate electrode 5. A first insulating layer 6 covers the transistor and the field oxide film, on which a capacitor element 10, which includes a bottom electrode 7, a capacitor dielectric layer 8 and a top electrode 9, is formed. The capacitor element 10 is covered with a second insulating layer 15 such as a phosphorous doped silicon dioxide film, that is, a PSG film. Some contact holes are formed through the first insulating layer 6 to reach to the diffused layer 3 of the transistor, and others are formed through the second insulating layer 15 to reach to the bottom or top electrode 7, 9 of the capacitor element. Wiring layers 13a, 13b are formed on the insulating layers to have electrical contacts with the element through the contact holes. These elements and layers formed on the silicon substrate 1 are covered with a passivation layer 14.

A conventional method for producing a semiconductor device having a capacitor element is explained below referring to the flow chart of FIG. 9 in addition to FIG. 8.

As shown in FIG. 9, in order to form a transistor (i.e. the "circuit element" shown in FIG. 9), a field oxide layer 2, a diffused layer 3, a gate insulator 4 and a gate electrode 5 are formed in and on a silicon substrate 1. In order to cover the elements and the layers, a first insulating layer 6 is formed, followed by forming a bottom electrode 7, a capacitor dielectric layer 8 and a top electrode 9 on the first insulating layer 6 to make a capacitor element 10. In general, the dielectric layer 8 is heat-treated after forming a pattern of the capacitor element 10 or directly after forming the capacitor dielectric layer 8. For example, the dielectric layer 8 is composed of a high dielectric, while each of the bottom and top electrodes is composed of a platinum film at the closer side to the dielectric and a titanium film at the far side from the dielectric. In order to cover the capacitor element 10, a second insulating layer 15 such as a PSG film is formed by chemical vapor deposition or the like, followed by forming contact holes 12a, 12b to reach the diffused layer 3 or the electrodes 7, 9. Subsequently, wiring layers 13a, 13b are formed on the insulating layers 6, 15 so that some parts of the first wiring layer 13a reach to the diffused layer 3 through the contact holes 12a in the first insulating layer 6, and some parts of the layer 13b reach to the electrodes 7, 9 through the contact holes 12b in the second insulating layer 15. The wiring layers are covered with a passivation layer 14. As a passivation layer 14, a silicon nitride film or a silicon nitride oxide film formed by plasma chemical vapor deposition (plasma CVD) is preferably used because of a high moisture resistance.

In a process for producing a MOS transistor, heat-treatment in a hydrogen atmosphere (hereinafter, hydrogen-treatment) is generally necessary to recover the damaged interface of the silicon substrate with the insulating layer, especially with the gate insulator. However, when a semiconductor device includes a capacitor element with a high dielectric as a capacitor dielectric layer, the high dielectric degrades by hydrogen-treatment.

As a method to solve such degradation of a high dielectric, Japanese Patent Publication No. 7-226443 (Tokkai-Hei No. 7-226443) shows a process, including the steps of: forming a capacitor element above a substrate having an integrated circuit element, forming an interlayer insulator to cover the substrate, forming contact holes through the interlayer insulator to reach the integrated circuit element, and heat-treating the substrate before forming the contact holes to reach the capacitor element. Thus, hydrogen can be supplied to the integrated circuit element that has a damaged interface through the contact holes, while hydrogen cannot easily arrive at the capacitor element because the contact holes have not been formed yet.

Such a process can be applied only before forming the wiring layers. When two or more wiring layers are formed for a multilayer interconnection, it cannot recover the damage generated after forming the first wiring layer at the interface in a MOS transistor. Moreover, as the process cannot effectively prevent hydrogen from arriving at the capacitor element, a capacitor dielectric layer such as a high dielectric containing bismuth that is heavily degraded by hydrogen cannot avoid a change in the characteristics of the capacitor element to some extent.

SUMMARY OF THE INVENTION

Therefore, with the foregoing in mind, it is the object of the present invention to provide a semiconductor device with a multilayered interconnection and a capacitor element in which the transistors in the device have non-degraded characteristics and the degradation of the capacitor element is suppressed.

In order to achieve the above-described object, a semiconductor device of the present invention comprises a substrate including a semiconductor integrated circuit element, a first insulating layer on the substrate, a capacitor dielectric element on the first insulating layer, which includes a bottom electrode, a capacitor dielectric layer and a top electrode, a second insulating layer so as to cover the capacitor element, first contact holes formed through the first insulating layer and/or the second insulating layer, and a first wiring layer on the first insulating layer and/or the second insulating layer so that the first wiring layer has an electrical contact with the semiconductor element and/or the capacitor element through the first contact holes.

The semiconductor device further comprises a third insulating layer so as to cover the first wiring layer, second contact holes formed through at least the third insulating layer, a second wiring layer on the third insulating layer having an electrical contact with the first wiring layer through the second contact holes, and a fourth insulating layer. The fourth insulating layer is formed so as to cover at least a part of the area above the semiconductor integrated circuit element and so as not to cover the area above the capacitor dielectric element.

Such a semiconductor device of the present invention can be manufactured by a method which comprises forming a first insulating layer on a substrate including a semiconductor integrated circuit element, forming a capacitor dielectric element on the first insulating layer including a bottom electrode, a capacitor dielectric layer and a top electrode, forming a second insulating layer so as to cover the capacitor element, forming first contact holes through the first insulating layer and/or the second insulating layer, and forming a first wiring layer on the first insulating layer and/or the second insulating layer so that the first wiring layer has an electrical contact with the semiconductor element and/or the capacitor element through the first contact holes.

The method further comprises steps of forming a third insulating layer so as to cover the first wiring layer, forming second contact holes through at least the third insulating layer, forming a second wiring layer on the third insulating layer so that the second wiring layer has an electrical contact with the first wiring layer through the second contact holes, forming a fourth insulating layer and heat-treating the fourth insulating layer. The fourth insulating layer is formed so as to cover at least a part of the area above the semiconductor integrated circuit element and so as not to cover the area above the capacitor dielectric element.

Hydrogen is supplied from the fourth insulating layer to the semiconductor integrated circuit element to recover the damage at the interface of the element, while suppressing the degradation of the capacitor element because the fourth insulating layer is not formed above the capacitor element.

These and other advantages of the present invention will become apparent those skilled in the art upon reading and understanding the following detailed description.

DESCRIPTION OF THE PREFERRED EMBODIMENTS

Figure 1:
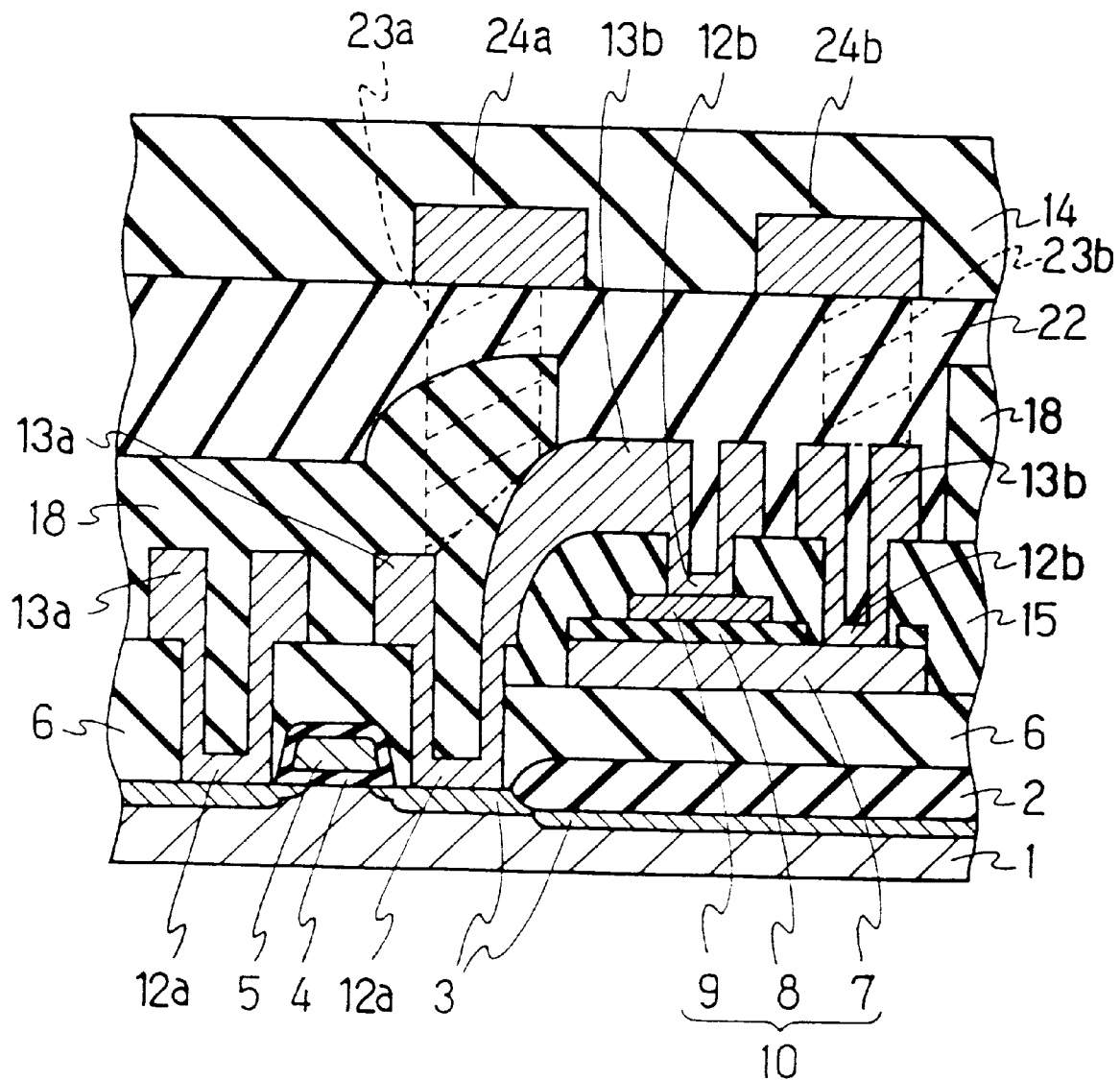
FIG. 1 is a partial cross-sectional view to show a semiconductor device of an embodiment of the present invention.

In the semiconductor device of the invention, it is preferred that the device further comprises a passivation layer so as to cover the second wiring layer.

In the semiconductor device, the fourth insulating layer can be formed on the first wiring layer and/or the third insulating layer. The fourth insulating layer on the first wiring layer is preferably covered with the third insulating layer. When being formed on the third insulating layer, the fourth insulating layer is preferably covered with the passivation layer.

In the semiconductor device, the fourth insulating layer preferably contains silicon nitride and/or silicon nitride oxide, because the transistor can be easily stabilized. A silicon nitride film and a silicon nitride oxide film contain more hydrogen than other films such as a silicon oxide film used in a process for producing a semiconductor device. The fourth insulating layer can be composed of two or more films.

In the semiconductor device, the fourth insulating layer formed by plasma CVD can be preferably used. A silicon nitride film and a silicon nitride oxide film formed by plasma CVD in particular contain much hydrogen. Thus, it is preferred that the fourth insulating layer containing hydrogen is formed in such a manner.

In the semiconductor device, the fourth insulating layer can be either one of a monolayer and a multilayer. The multilayer preferably includes a hydrogen absorbing metal film.

The present invention is effective especially in the semiconductor device in which the capacitor dielectric layer contains bismuth. As such a capacitor dielectric layer, $BaBi_2Ta_xNb_{2-x}O_9$, $Bi_4Ti_3O_{12}$, $SrBi_2Ta_xNb_{2-x}O_9$, $SrBi_4Ti_4O_{15}$, $PbBi_2Ta_xNb_{2-x}O_9$, $PbBi_4Ti_4O_{15}$ and $Sr_xBa_yPb_{2-x-y}Bi_4Ti_5O_{18}$ can be used, wherein x is between 0 and 2, and x+y is between 0 and 2.

In the method for manufacturing a semiconductor device, the fourth insulating layer is heat-treated at 300° C. or more, because hydrogen is effectively supplied to the circuit element. The fourth insulating element is more preferably heated to a temperature less than at least one of the melting points of the materials of the wiring layers. When the first and second wiring layers are formed, the temperature less than a melting point of the material of the first wiring layer and/or the material of the second wiring layer is preferred.

The present invention is explained below referring to the drawings. In each embodiment, the explanation focuses on the points different from a conventional device as explained above.

First Embodiment

An embodiment of a semiconductor device of the present invention is explained referring to FIG. 1.

As shown in FIG. 1, first contact holes 12a, 12b are formed through insulating layers. The first contact holes include contact holes 12a reaching to a diffused layer 3 through a first insulating layer 6 and contact holes 12b reaching to a bottom electrode 7 or a top electrode 9 of a capacitor element 10 through a second insulating layer 15. A first wiring layer 13a, 13b of conducting material such as Al or Cu is formed on the insulating layers and has electrical contacts with the diffused layer and the electrodes 7, 9 through the first contact holes 12a, 12b. A third insulating layer 22 and a fourth insulating layer 18 are formed to cover the first wiring layer 13a, 13b. The fourth insulating layer 18 is formed so that the capacitor element 10 is not covered with the layer 18, while the third insulating layer 22 composed of a compound such as silicon oxide or silicon oxide fluoride is formed so that the layer 22 covers the capacitor element 10 and the fourth layer 18. Second contact holes 23a, 23b that are not directly shown in the cross-section of FIG. 1 are formed through at least the third insulating layer 22 to reach to the first wiring layer 13a, 13b. A second wiring layer 24a, 24b of conducting material such as Al or Cu is formed on the third insulating layer 22 and has electrical contact with the first wiring layer 13a, 13b through the second contact holes 23a, 23b. A passivation layer 14 is formed to cover the second wiring layers 24a, 24b.

Although a film of silicon nitride or silicon nitride oxide is used as a fourth insulating layer 18 in the above embodiment, other films containing hydrogen also can be used. Such a film may have a multilayered structure which includes insulating layers and a layer of hydrogen absorbing metal between them, for example.

Although a semiconductor device as shown above has two wiring layers and one insulating layer between them above the capacitor, the invention is not limited to such an embodiment. Three or more of wiring layers can be formed above the substrate, as long as at least one insulating layer that can supply hydrogen to the circuit element while suppressing hydrogen from arriving at the capacitor element is formed between the wiring layers, such as the fourth insulating layer 18 in FIG. 1.

Second Embodiment

Figure 2:
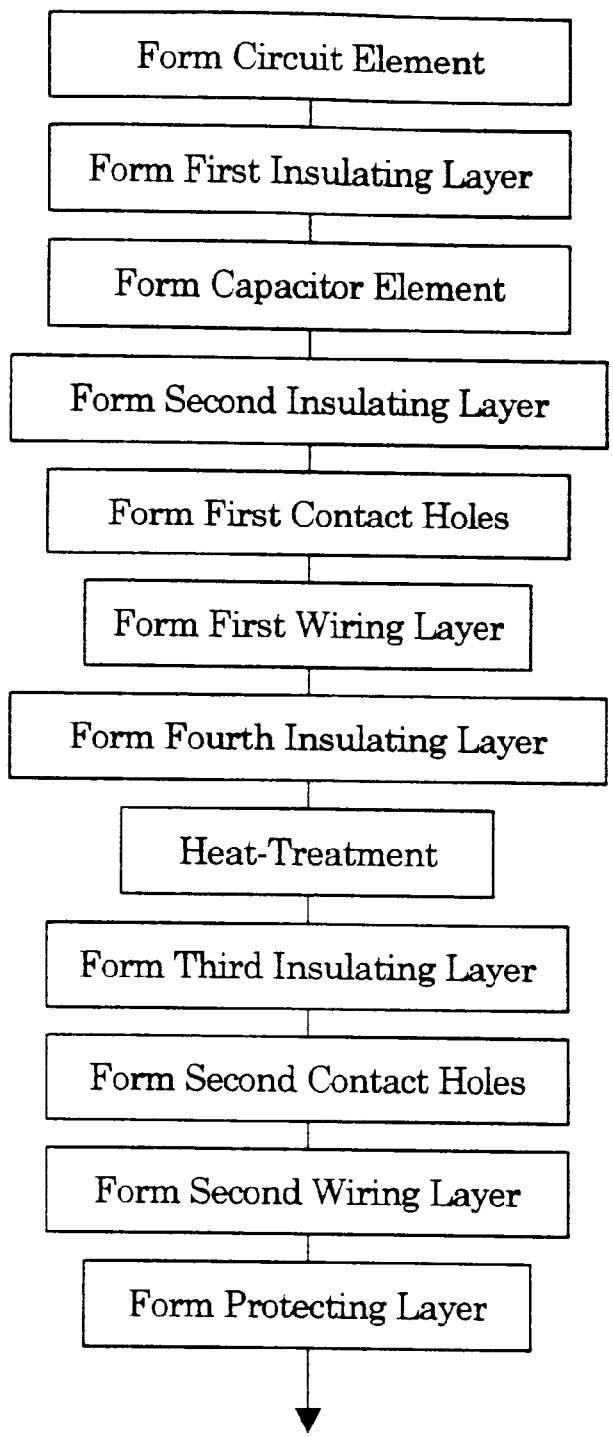
FIG. 2 is a flow chart to show steps of a method for manufacturing a semiconductor device of an embodiment of the present invention.

An embodiment of a method for producing a semiconductor device as described above in the above embodiment is explained below referring to the flow chart of FIG. 2 in addition to FIG. 1.

The method is different from a conventional method in the steps on and after forming first contact holes. As described above, a transistor including a diffused layer 3, a gate insulator 4 and a gate electrode 5 (i.e. the "circuit element" in FIG. 2) is formed in and on a silicon substrate 1. For covering the transistor, a first insulating layer 6 is formed on the substrate 1, followed by forming a capacitor element 10, which includes a bottom electrode 7, a capacitor element 8 and a top electrode 9. Next, a second insulating layer 15 is formed to cover the capacitor element 10.

Subsequently, first contact holes 12a, 12b are formed through the insulating layer. Some contact holes 12a are formed to reach the diffused layer 3, while some contact holes 12b are formed to reach the top or bottom electrode 7, 9. A first wiring layer 13a, 13b of an electrically conductive material such as Al, Cu is formed on the insulating layer. Some parts of the wiring layer 13a have electrical contact with the diffused layer 3 through some of the first contact holes 12a, and some parts of the wiring layer 13b have electrical contact with the top or bottom electrode 7, 9 through some of the first contact holes 12b. A fourth insulating layer 18 is formed on the first wiring layer 17a, 17b. The fourth insulating layer 18 is preferably a silicon nitride film or a silicon nitride oxide film because those films include more hydrogen. After a part of the fourth insulating layer 18 that includes the area above the capacitor element 10 is removed, the remaining fourth insulating layer is heat-treated. A third insulating layer 22 of silicon oxide or the like is formed to cover the multilayered structure on the substrate, followed by forming second contact holes 23a, 23b to reach to the first wiring layer 13a, 13b. A second wiring layer 24a, 24b is formed on the third insulating layer 22 so that a multilayer interconnection is realized by electrical contacts between the first wiring layer 13a, 13b and the second wiring layer 24a, 24b.

A passivation layer 14 is formed on the third insulating layer 22 to cover the second wiring layer 24a, 24b. The passivation layer 14 is preferably composed of a high moisture-resistant material such as silicon nitride and silicon nitride oxide to prevent moisture from penetrating into the substrate 1, the capacitor element 10 and the first and second wiring layers 17, 24. The passivation layer preferably has a thickness between 600 nm and 1000 nm.

As the fourth insulating layer 18, a film containing hydrogen can be formed instead of a silicon nitride film or a silicon nitride oxide film. The fourth insulating layer 18 is not limited to a single layer, but can be a multilayer including a film containing hydrogen. As such a multilayer, the multilayer having insulating films and a hydrogen absorbing metal film between the insulating films can be used. Moreover, the method as described above can be applied to a multilayered structure having three or more wiring layers above a capacitor element as long as an insulating layer corresponding to the fourth insulating layer 18 is formed at any one of spaces between the wiring layers.

The fourth insulating layer 18 can be heat-treated in an atmosphere such as nitrogen and inert gas (e.g. argon) or in oxygen. When the high dielectric in the capacitor element is composed of an oxide, the heat-treatment in oxygen is desirable to improve the characteristics of the high dielectric.

The fourth insulating layer 18 preferably includes a silicon nitride film, a silicon nitride oxide film or a multilayered film having a silicon nitride film or a silicon nitride oxide film as a component. As such a film contains more hydrogen than a silicon oxide film or other films formed in a process for producing a semiconductor device, heating the film such as a silicon nitride film is effective to stabilize the characteristics of the transistor. Forming the film by plasma CVD increases the effect to make it possible to heat-treat at a lower temperature.

Figure 5:
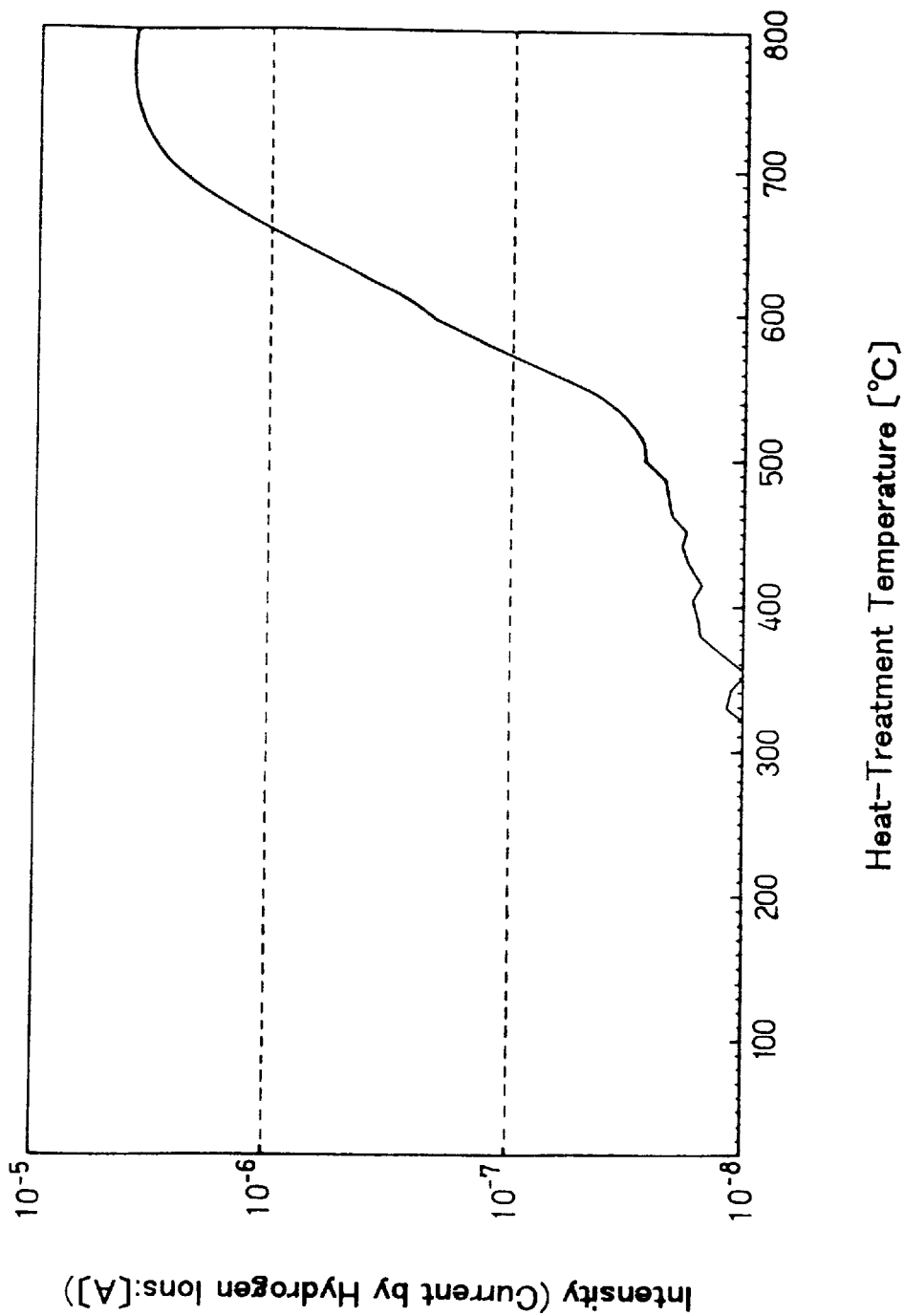
FIG. 5 is graph to show a current generated by hydrogen ions supplied by heat-treatment of a silicon nitride film formed by plasma CVD with respect to a temperature of the heat-treatment.

FIG. 5 shows an electric current intensity generated by hydrogen ions out of a silicon nitride film with respect to a heat-treatment temperature. The silicon nitride film was formed by plasma CVD. As shown in FIG. 5, the heat-treatment at 300° C. or more can provide hydrogen ions. However, the heat-treatment at or above a melting point of the material of the wiring layer may cause trouble in the semiconductor device. Therefore, the preferable heat-treatment temperature is in the range of 300° C. to less than the melting point of the material of the wiring layers. For example, when Al (melting point: 660.4° C.) is used as the wiring layer material, the preferable heat-treatment temperature is in the range of 330° C. to less than 660.4° C. When Cu (melting point: 1083.4° C.) is used as the wiring layer material, the preferable heat-treatment temperature is in the range of 330° C. to less than 1083.4° C.

Third Embodiment

Another embodiment of a semiconductor device having a multilayer interconnection structure with a capacitor element is explained below referring to FIG. 3.

Figure 3:
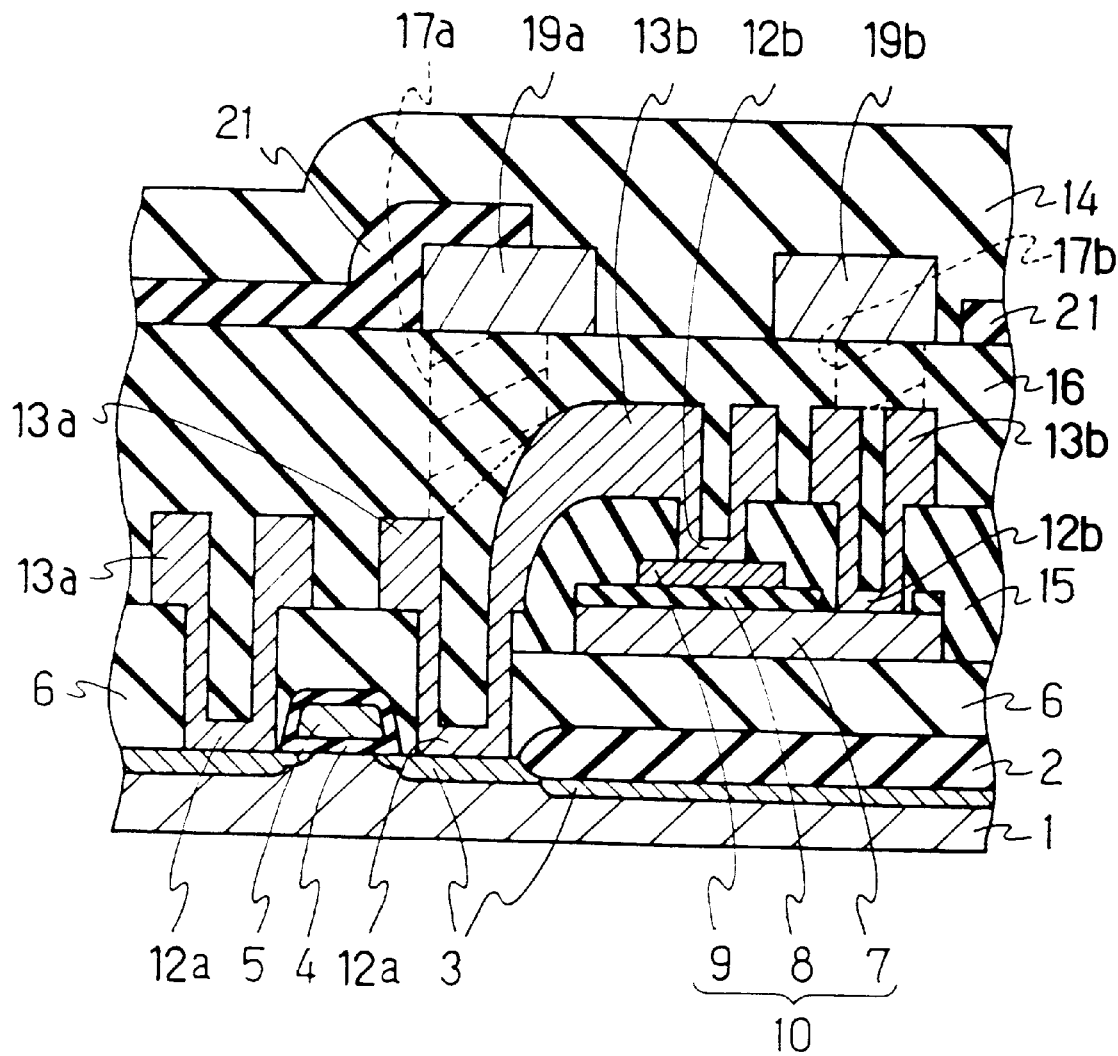
FIG. 3 is a partial cross-sectional view to show a semiconductor device of another embodiment of the present invention.

As shown in FIG. 3, first contact holes 12a, 12b are formed through insulating layers. The first contact holes include contact holes 12a reaching to a diffused layer 3 through a first insulating layer 6 and a contact hole 12b reaching to a bottom electrode 7 or a top electrode 9 of a capacitor element 10 through a second insulating layer 15. A first wiring layer 13a, 13b of an electrical conductive material such as Al or Cu is formed on the insulating layers and has electrical contacts with the diffused layer and the electrodes 7, 9 through the first contact holes 12a, 12b. A third insulating layer 16 of a silicon oxide film, a silicon oxide fluoride film or the like is formed to cover the first wiring layer 13a, 13b. Second contact holes 17a, 17b that are not directly shown in FIG. 3 are formed through at least the third insulating layer 16 to reach to the first wiring layer 13a, 13b. A second wiring layer 19a, 19b of conducting material such as Al or Cu is formed on the third insulating layer 16 and has electrical contact with the first wiring layer 13a, 13b through the second contact holes 17a, 17b.

A fourth insulating layer 21 of a silicon nitride film or a silicon nitride oxide film and a passivation layer 14 are formed on the third insulating layer 16. The fourth insulating layer 21 is formed so that the capacitor element 10 is not covered with the layer 21, while the passivation layer covers the capacitor element 10 and the second wiring layer 19a, 19b.

A film containing hydrogen can be used as the fourth insulating layer 21 instead of a silicon nitride film or a silicon nitride oxide film. The fourth insulating layer 21 is not limited to a single layer, but can be a multilayer including a film containing hydrogen. As such a multilayer, the multilayer including insulating films and a hydrogen absorbing metal film between the insulating films can be used. Moreover, the method as described above can be applied to a multilayered structure having three or more wiring layers above the substrate as long as an insulating layer that can supply hydrogen to the circuit element while preventing hydrogen from arriving at the capacitor element is formed on any one of the wiring layers except the first wiring layer. The method also can apply to a semiconductor device with a single wiring layer above a capacitor element.

Fourth Embodiment

Figure 4:
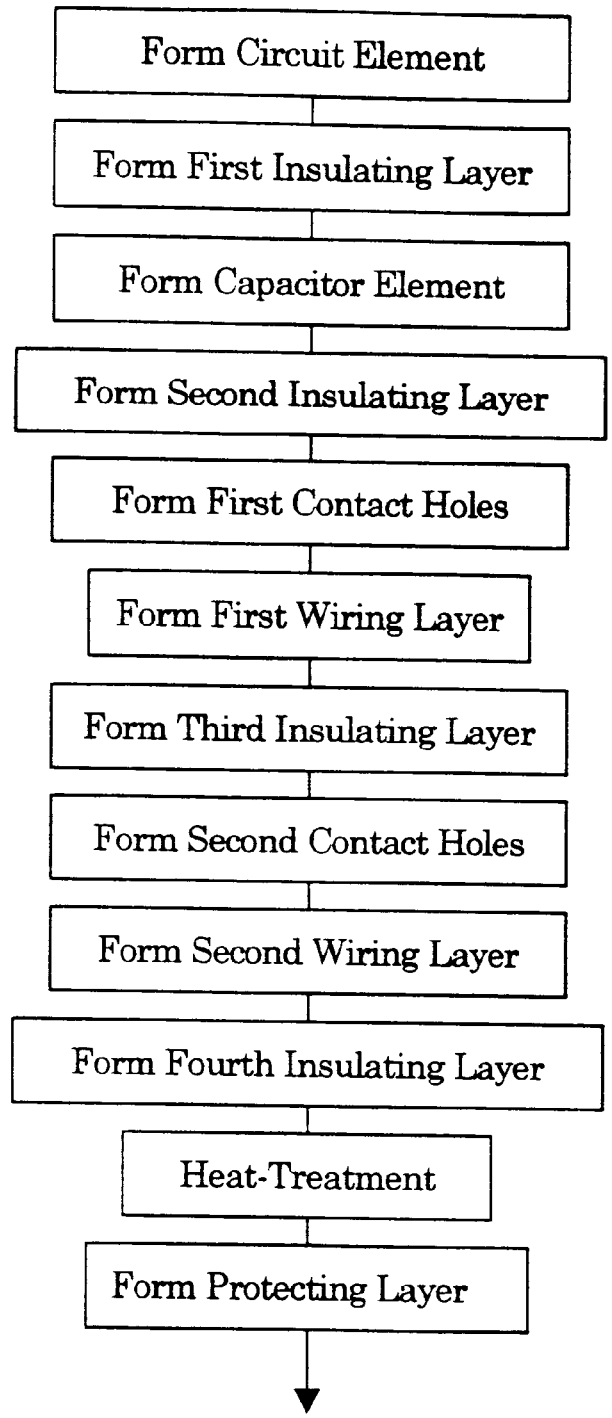
FIG. 4 is a flow chart to show steps a method for manufacturing a semiconductor device of another embodiment of the present invention.

An embodiment of a method for producing a semiconductor device as explained in the third embodiment is explained below referring to a flow chart of FIG. 4 in addition to FIG. 3.

The method is different from a conventional method in the steps on and after forming first contact holes. As described above, a transistor including a diffused layer 3, a gate insulator 4 and a gate electrode 5 (the "circuit element" in FIG. 4) is formed in and on a silicon substrate 1. For covering the transistor, a first insulating layer 6 is formed on the substrate 1, followed by forming a capacitor element 10, which includes a bottom electrode 7, a capacitor element 8 and a top electrode 9. Next, a second insulating layer 15 is formed to cover the capacitor element 10.

Subsequently, first contact holes 12a, 12b are formed through the insulating layer. Some contact holes 12a are formed to reach the diffused layer 3, while some contact holes 12b are formed to reach the top or bottom electrode 7, 9. A first wiring layer 13a, 13b of an electrically conductive material such as Al or Cu is formed on the insulating layer. Some parts of the wiring layer 17a have electrical contact with the diffused layer 3 through some of the first contact holes 12a, and some parts of the wiring layer 17b have electrical contacts with the top or bottom electrode 7, 9 through some of the first contact holes 12b. A third insulating layer 16 such as a silicon oxide film is formed to cover the first wiring layer 18a, 18b, followed by forming second contact holes 17a, 17b to reach to the first wiring layer 13a, 13b. A second wiring layer 19a, 19b is formed on the third insulating layer 16 to realize a multilayer interconnection by electrical contact between the first wiring layer 13a, 13b and the second wiring layer 19a, 19b. A fourth insulating layer 21 is formed on the third insulating layer. The fourth insulating layer 21 is preferably a silicon nitride film or a silicon nitride oxide film that includes hydrogen. After a part of the fourth insulating layer 21 that includes the area above the capacitor element 10 is removed, the remaining fourth insulating layer is heat-treated. A passivation layer 14 is formed to cover the layers. The passivation layer 14 is preferably composed of a high moisture-resistant material such as silicon nitride and silicon nitride oxide to prevent moisture from penetrating into the substrate 1, the capacitor element 10 and the first and second wiring layers 17, 24. The passivation layer preferably has a thickness between 600 nm and 1000 nm.

As the fourth insulating layer 21, a film containing hydrogen can be used instead of a silicon nitride film or a silicon nitride oxide film. The fourth insulating layer 21 is not limited to a single layer, but can be a multilayer including a film containing hydrogen, as described above.

The fourth insulating layer 21 can be heat-treated in an atmosphere such as nitrogen or inert gas (e.g. argon) or in oxygen.

As described above, the fourth insulating layer 21 preferably includes a silicon nitride film, a silicon nitride oxide film or a multilayered film having a silicon nitride film or a silicon nitride oxide film as a component. Such a film contains more hydrogen than a silicon oxide film or other films formed in a process for producing a semiconductor device, and heating the film is effective to stabilize the property of the transistor. Forming the film by plasma CVD increases the effect to make it possible to heat-treat at a lower temperature.

In this embodiment, the preferable heat-treatment temperature is also in the range of 300° C. to less than the melting point the material of the wiring layers as described above.

In the above embodiments, the capacitor dielectric layer may include a high dielectric containing bismuth. Although the high electric containing bismuth may be deeply degraded by hydrogen, the layered structure as described in the above embodiment can suppress the degradation of the capacitor. Examples of the high dielectric containing bismuth are follows:

[1] $BaBi_2Ta_2O_9$
[2] $BaBi_2Nb_2O_9$
[3] $Bi_4Ti_3O_{12}$
[4] $SrBi_2Ta_2O_9$
[5] $SrBi_2Nb_2O_9$
[6] $SrBi_4Ti_4O_{15}$
[7] $PbBi_2Ta_2O_9$
[8] $PbBi_2Nb_2O_9$
[9] $PbBi_4Ti_4O_{15}$
[10] $Sr_2Bi_4Ti_5O_{18}$
[11] $Ba_2Bi_4Ti_5O_{18}$
[12] $Pb_2Bi_4Ti_5O_{18}$

In the above compounds, the elements can be partially substituted with other elements such as $SrBi_2(Ta_{1.5}Nb_{0.5})O_9$. The compounds can be included in a capacitor dielectric layer as a single layer, a multilayer or a mixture layer with an insulator such as $SiO_2$.

EXAMPLES

Example 1

A first example is explained below referring to FIG. 1. In this example, $SrBi_2Ta_2O_9$ (thickness: 250 nm) was used as a capacitor dielectric layer 8 in a capacitor element 10. By the steps as described in the second embodiment, a fourth insulating layer 18 (a silicon nitride film formed by plasma CVD; thickness: 200 nm) was formed on the wafer, followed by removing a part of the fourth insulating layer that included the area above the capacitor element 10. The remaining part of the fourth insulating layer was heat-treated in nitrogen at 450° C. After a third insulating layer 22 was formed, second contact holes 23a, 23b, a second wiring layer 24a, 24b and a passivation layer 14 were formed.

Figure 6:
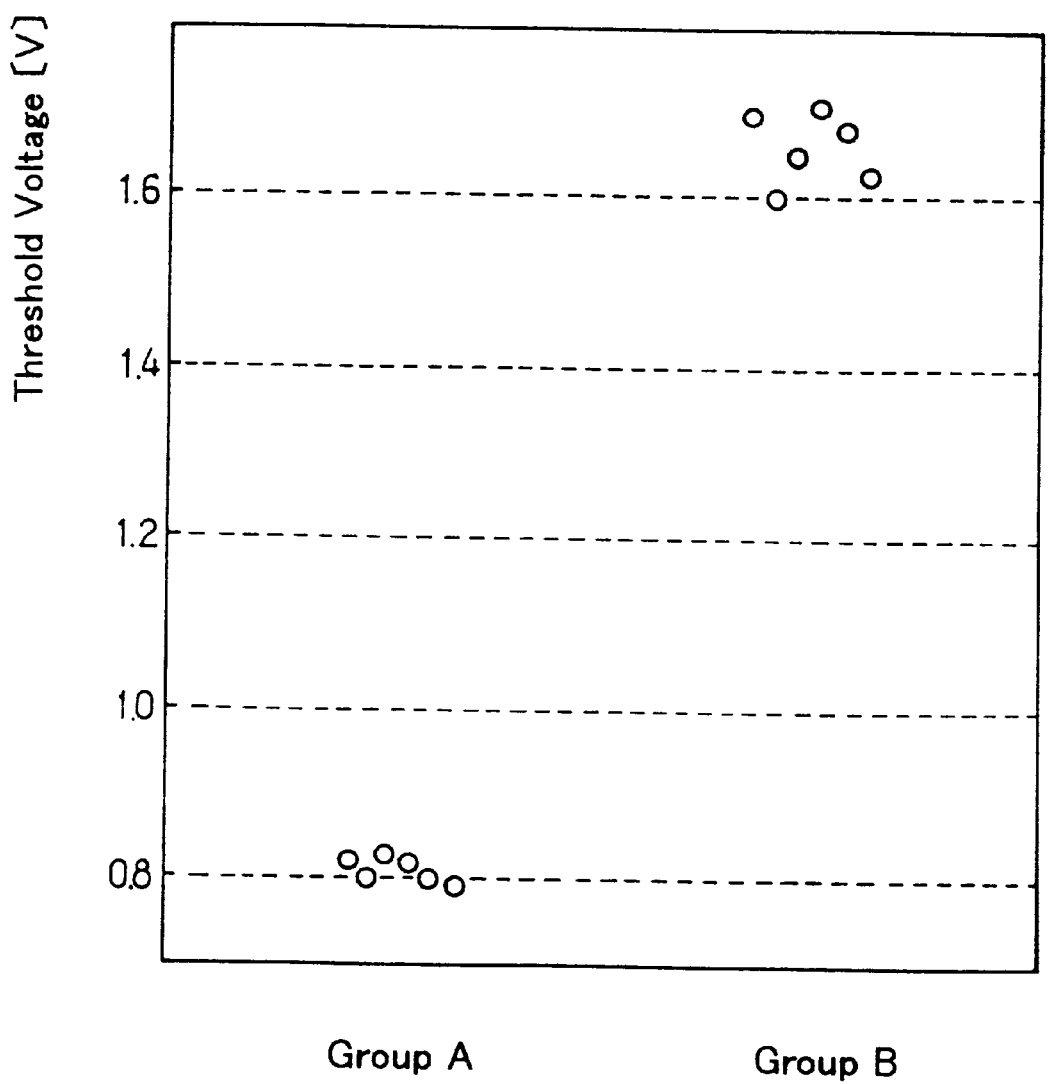
FIG. 6 is a graph to show a threshold voltage of N-type transistors of Group A produced by a method of an embodiment of the present invention and of Group B produced by a conventional method.

In FIG. 6, threshold voltages in N-channel transistors with a drain current of 1 μA are shown. Transistors of Group A were produced in accordance with the above example. Transistors of Group B were produced by the same process as described above except that the steps of forming a fourth insulating layer and heat-treatment were not done. Both of the transistor groups had the same size. As shown in FIG. 6, the threshold voltages in Group A are about 0.8 V, which shows a designed value, while those in Group B are 1.6V or more.

Figure 7:
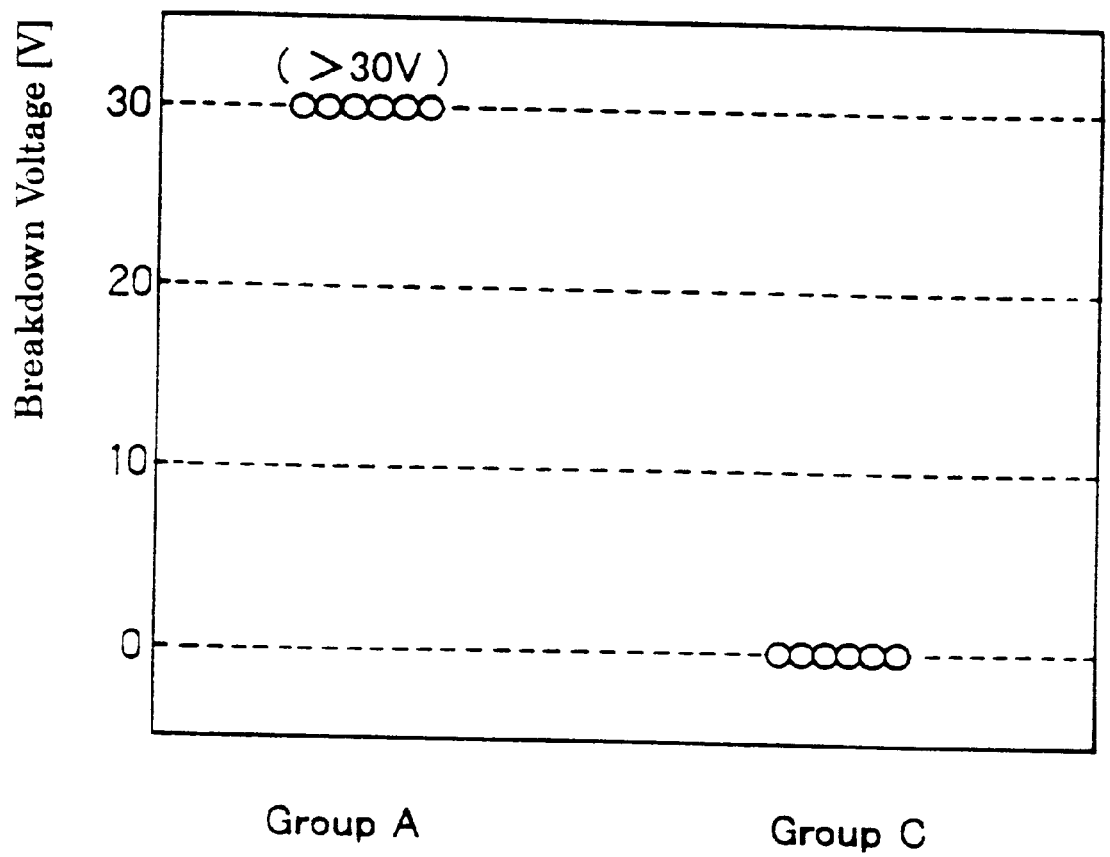
FIG. 7 is a graph to show a breakdown voltage of capacitor elements of Group A produced by a method of an embodiment of the present invention and of Group B produced by a conventional method.
Figure 8:
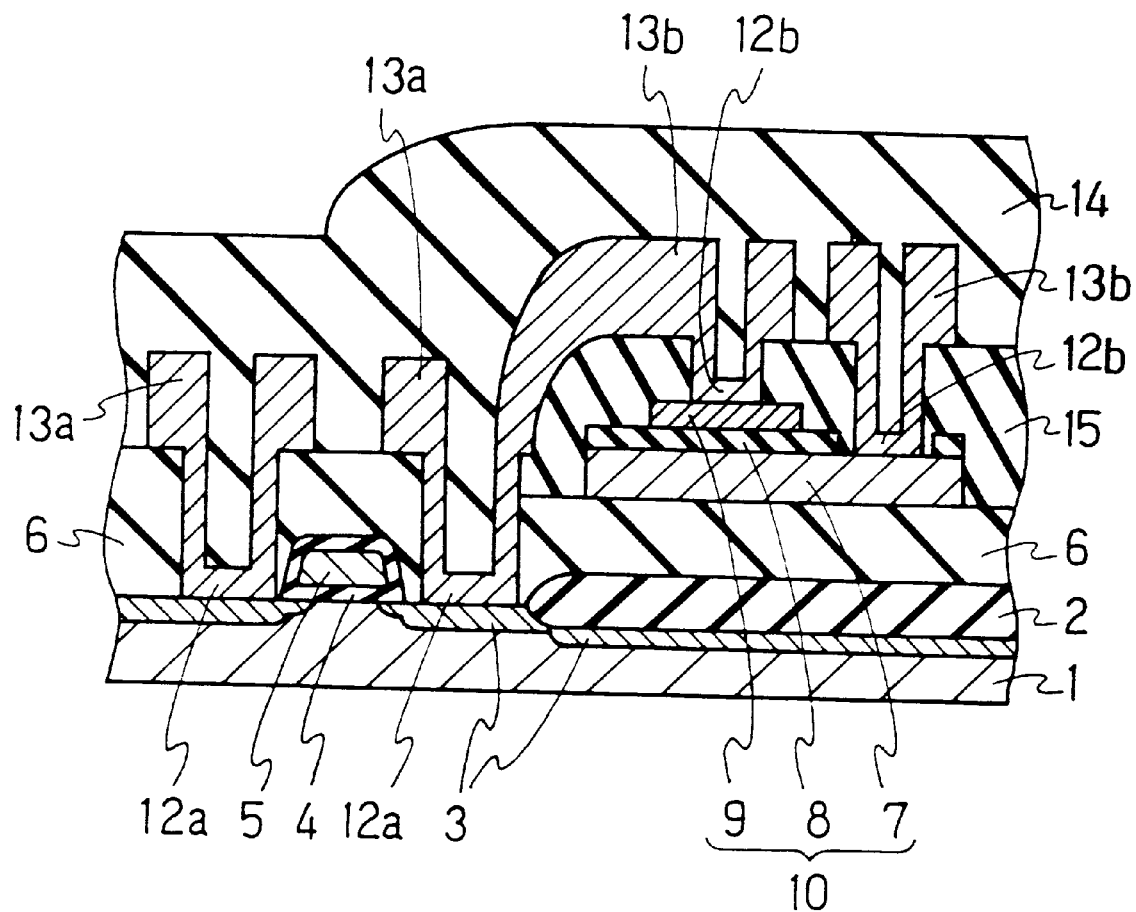
FIG. 8 is a partial cross-sectional view to show a conventional semiconductor device.
Figure 9:
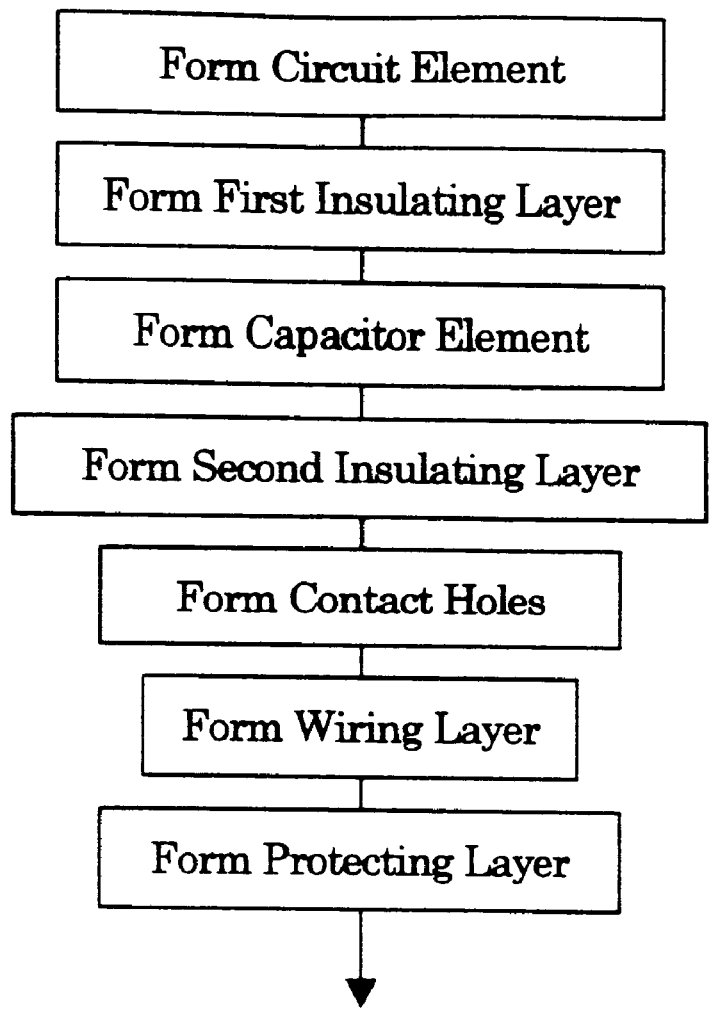
FIG. 9 is a flow chart to show steps of a conventional method for manufacturing a semiconductor device.

In FIG. 7, breakdown voltages in capacitor elements are shown. Capacitor elements of Group A were in accordance with the above example. Capacitor elements of Group C were produced by the same process as shown in FIG. 2 except that the steps of forming a fourth insulating layer and heat-treatment were not done and the step of hydrogen-treatment, needed for producing transistors, was added after forming a passivation layer. As shown in FIG. 7, the breakdown voltages in Group A are more than 30V, while those in Group C are 0V due to the degradation by hydrogen.

Example 2

A second example is explained below referring to FIG. 3. In this example, SrBi$_2$Ta$_2$O$_9$ (thickness: 250 nm) was used as a capacitor dielectric layer 8 in a capacitor element 10. By the steps as described in the fourth embodiment, a fourth insulating layer 21 (a silicon nitride film formed by plasma CVD; thickness 200 nm) was formed on the wafer, followed by removing a part of the fourth insulating layer that included the area above the capacitor element 10. The remaining part of the fourth insulating layer was heat-treated in nitrogen at 450° C. After the heat-treatment, a passivation layer 14 was formed.

Threshold voltages in N-channel transistors in accordance with the above example were about 0.8V. Those in N-channel transistors produced by the same process as described above except that the steps of forming a fourth insulating layer and heat-treatment were not done were 1.6V or more. Thus, the same values as shown in FIG. 6 were observed.

Breakdown voltages in capacitor elements in accordance with the above example were more than 30V. Those in capacitor elements produced by the same process as described above except that the steps of forming a fourth insulating layer and heat-treatment were not done and the step of hydrogen-treatment, needed for producing transistors, was added after forming a passivation layer were 0V. Thus, the same values as shown in FIG. 7 were observed.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A semiconductor device, comprising:

a substrate, the substrate including a semiconductor integrated circuit element;

a first insulating layer on the substrate;

a capacitor dielectric element on the first insulating layer, the capacitor dielectric element including a bottom electrode, a capacitor dielectric layer and a top electrode;

a second insulating layer covering the capacitor element;

first contact holes formed through at least one layer selected from the first insulating layer and the second insulating layer;

a first wiring layer on at least one layer selected from the first insulating layer and the second insulating layer, the first wiring layer having electrical contact with at least one element selected from the semiconductor element and the capacitor element through the first contact holes;

a third insulating layer covering the first wiring layer;

second contact holes formed through at least the third insulating layer;

a second wiring layer on the third insulating layer, the second wiring layer having electrical contact with the first wiring layer through the second contact holes; and a fourth insulating layer formed on at least one layer selected from the first wiring layer and the third insulating layer and covering at least a part of the area above the semiconductor integrated circuit element and not covering the area above the capacitor dielectric element.

2. A semiconductor device according to claim 1, further comprising a passivation layer covering the second wiring layer.

3. A semiconductor device according to claim 1, wherein the fourth insulating layer contains at least one material selected from silicon nitride and silicon nitride oxide.

4. A semiconductor device according to claim 1, wherein the fourth insulating layer contains hydrogen.

5. A semiconductor device according to claim 1, wherein the fourth insulating layer contains hydrogen absorbing metal.

6. A semiconductor device according to claim 1, wherein the capacitor dielectric layer contains bismuth.

7. A semiconductor device according to claim 6, wherein the capacitor dielectric layer contains at least one compound selected from BaBi$_2$Ta$_x$Nb$_{2-x}$O$_9$, Bi$_4$Ti$_3$O$_{12}$, SrBi$_2$Ta$_x$Nb$_{2-x}$O$_9$, SrBi$_4$Ti$_4$O$_{15}$, PbBi$_2$Ta$_x$Nb$_{2-x}$O$_9$, PbBi$_4$Ti$_4$O$_{15}$ and Sr$_x$Ba$_y$Pb$_{2-x-y}$Bi$_4$Ti$_5$O$_{18}$, wherein x is between 0 and 2, and x+y is between 0 and 2.

* * * * *